United States Patent [19]
Averitt et al.

[11] 3,967,195
[45] June 29, 1976

[54] CIRCUIT TESTER FOR THREE WIRE ELECTRICAL OUTLETS

[75] Inventors: Marnie Carlton Averitt, Timonium, Md.; Edward Dennman Bunnell, Palm Harbor, Fla.

[73] Assignee: AMP Incorporated, Harrisburg, Pa.

[22] Filed: Oct. 21, 1974

[21] Appl. No.: 516,709

[52] U.S. Cl. ................................ 324/51; 324/133; 340/255
[51] Int. Cl.² ...................................... G01R 31/02
[58] Field of Search ............... 324/51, 66, 133, 156; 315/133; 317/18 B; 340/255; 339/113 L

[56] References Cited
UNITED STATES PATENTS

| | | | |
|---|---|---|---|
| 3,383,588 | 5/1968 | Stull et al. ................ | 339/113 L X |
| 3,559,200 | 1/1971 | Walters ........................ | 340/255 |
| 3,588,861 | 6/1971 | Meyer .......................... | 324/51 UX |
| 3,783,371 | 1/1974 | McMillan ..................... | 324/51 |

*Primary Examiner*—James B. Mullins
*Attorney, Agent, or Firm*—Robert W. Pitts; Frederick W. Raring; Jay L. Seitchik

[57] ABSTRACT

A hand held circuit tester for use in detecting and identifying wiring errors in standard three-wire electrical outlets. Indicator lights, connected between each pair of the three plug-type terminals, are positioned side-by-side on one end of the device. Reference characters may then be aligned with the individual lights and the condition of the wiring can readily be determined. Because of the location of the indicator lights, they may be viewed through openings on three sides permitting use of the device in awkward locations. The components used in the manufacture of the device permit easy assembly of the components into circuits and facilitate insertion of the circuits into an insulated housing to form the completed device.

6 Claims, 6 Drawing Figures

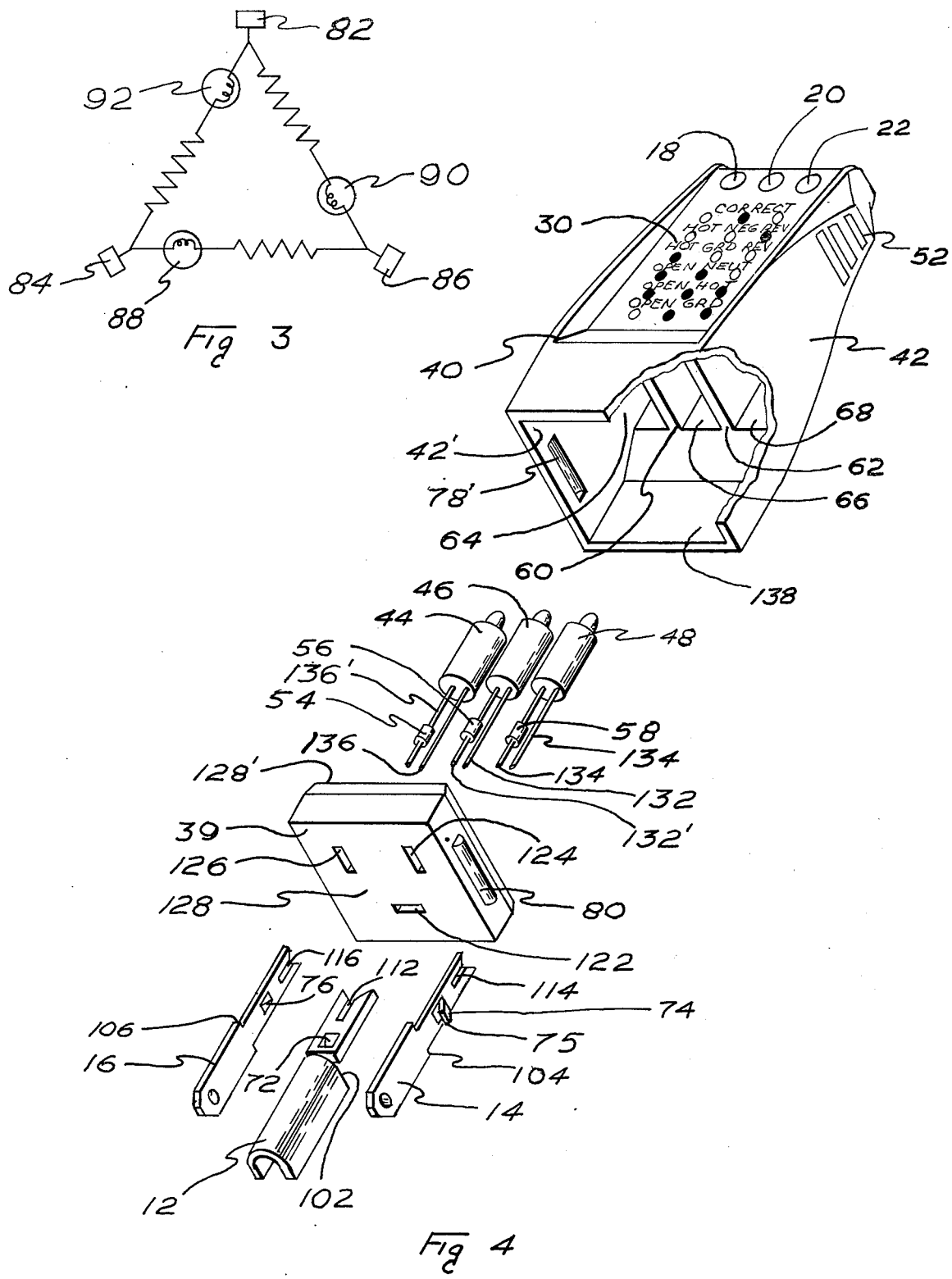

CIRCUIT TESTER FOR THREE WIRE ELECTRICAL OUTLETS

BACKGROUND OF THE INVENTION

This invention relates to the testing of standard three-wire ground type electrical outlets. While providing a measure of safety in case of an electrical failure, such outlets present wiring complications not encountered with standard two-wire outlets. No longer may the wires be randomly connected to terminals in the outlet. Unless, the hot, neutral, and ground wires are connected to the proper terminals, the three-wire outlets will present a potential hazard rather than a safety measure.

A quick, easy and inexpensive way to locate such wiring errors is provided by use of this invention. If indicating devices such as lights are connected between each pair of terminals only the lights between the hot terminal and either the ground or neutral terminals will be energized. An improperly wired outlet will be detected when the proper combination of indicators or lights is not displayed.

Other devices have employed this same technique. U.S. Pat. Nos. 3,317,825 and 3,383,588 present devices employing the same circuitry as used in this invention. The circuitry employed does not, however, constitute the gist of this invention. In the invention here disclosed the physical arrangement of the indicator display provides advantages over similar devices. This invention locates the indicator display on one end of the device. A chart showing the meaning of different combinations of energized indicators can then be placed along one side of the device. Easier reference between the chart and the display is therefore possible. The assembly of this invention also demonstrates decided advantages over that of other such devices. Fewer parts are required and those used can generally be easily assembled by snapping or wedging them into place.

An important object of the invention is to provide an inexpensive, easy to use, hand-held tester for use with three-wire electrical outlets. Such a device can then be used by a relatively unskilled technician to locate wiring errors. A further object is to provide such a tester incorporating a display which can be seen from several different directions so that the tester can be utilized with awkwardly positioned outlets. Another object is to provide a circuit tester designed so that a reference chart may be placed proximate to and in alignment with the indicator display, thus allowing direct reference between the chart and the display. A still further object of this invention is to provide a tester which may be constructed from relatively few parts and largely without the use of soldering and extraneous adhesive agents.

These and other objects of this invention will be apparent and can be more fully understood from the following description, which taken in connection with the accompanying drawings, discloses a preferred embodiment of the invention.

Referring to the drawings:

FIG. 3 is a diagram of the electrical circuit employed in this embodiment of the device.

FIG. 4 is a telescoped view showing the various components and assembly of the device.

Figure 1:
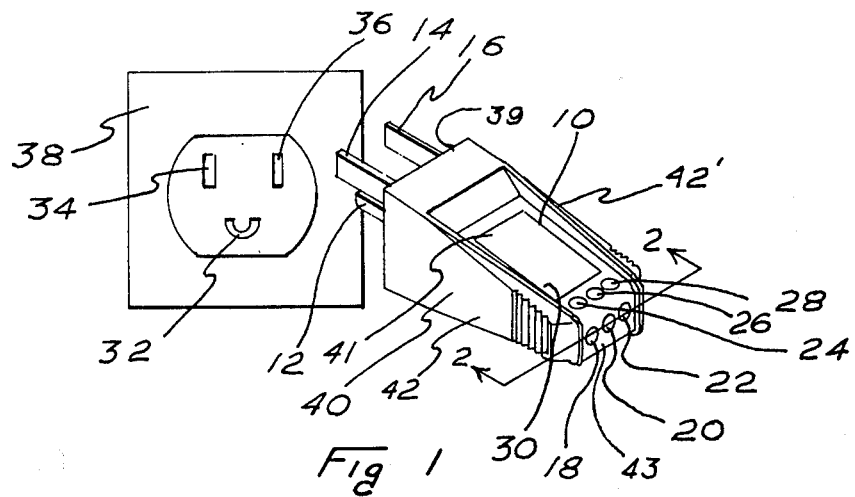
FIG. 1 is a perspective view of the circuit testing device and a standard three wire outlet.

The circuit tester 10 shown in FIG. 1 has three prongs 12, 14, 16 which can be inserted into the sockets 32, 34 and 36 of a standard three-wire electrical outlet 38. The prongs 12, 13, 14 are the same as those which might be found on a typical electrical appliance plug. Prongs 14 and 16 are identical and are of the type used on either a two or three-wire plug. The third or ground prong 12 is not the same type as prongs 14 and 16 and can only be inserted into socket 32. This dissimilarity insures that the ground wire of an electrical apparatus will be connected with the ground wire in a properly wired three-wire electrical outlet.

FIG. 1 also shows the general design of the insulating housing 40 used with the circuit tester 10. The housing is wedge-shaped with sidewalls 41 and 41' relatively larger than endwalls 42 and 42'. The three prongs 12, 14 and 16 extend from the base 39. The top wall 43 is opposite the base and proximate to the apex of the wedge housing. In the embodiment shown in FIG. 1 the top wall contains three side-by-side viewing ports or holes 18, 20, and 22. It can be seen from FIG. 2 that these holes are aligned with the lights contained within the housing. Three more side-by-side holes 24, 26 and 28 are located in sidewall 41 proximate to the topwall 43. The opposite sidewall contains three identical holes which are not shown. It can be seen that the three holes in the sidewall are aligned with the three holes in the topwall. It therefore follows that each of the sidewall holes 24, 26, and 28 must be aligned with one of the underlying lights. A reference chart or key 30 is attached to one sidewall 41. Each possible lighting pattern is shown on the chart together with a notation of the wiring fault discovered. The particular design of the tester enables the respective characters for each reference state shown to be aligned with the individual viewing holes. Such convenient reference should prevent much potential confusion on the part of an unskilled technician who might utilize the device. The chart 30 shown in FIG. 4 includes the potential patterns that could result from use of device with a circuit such as that of FIG. 3.

Figure 2:
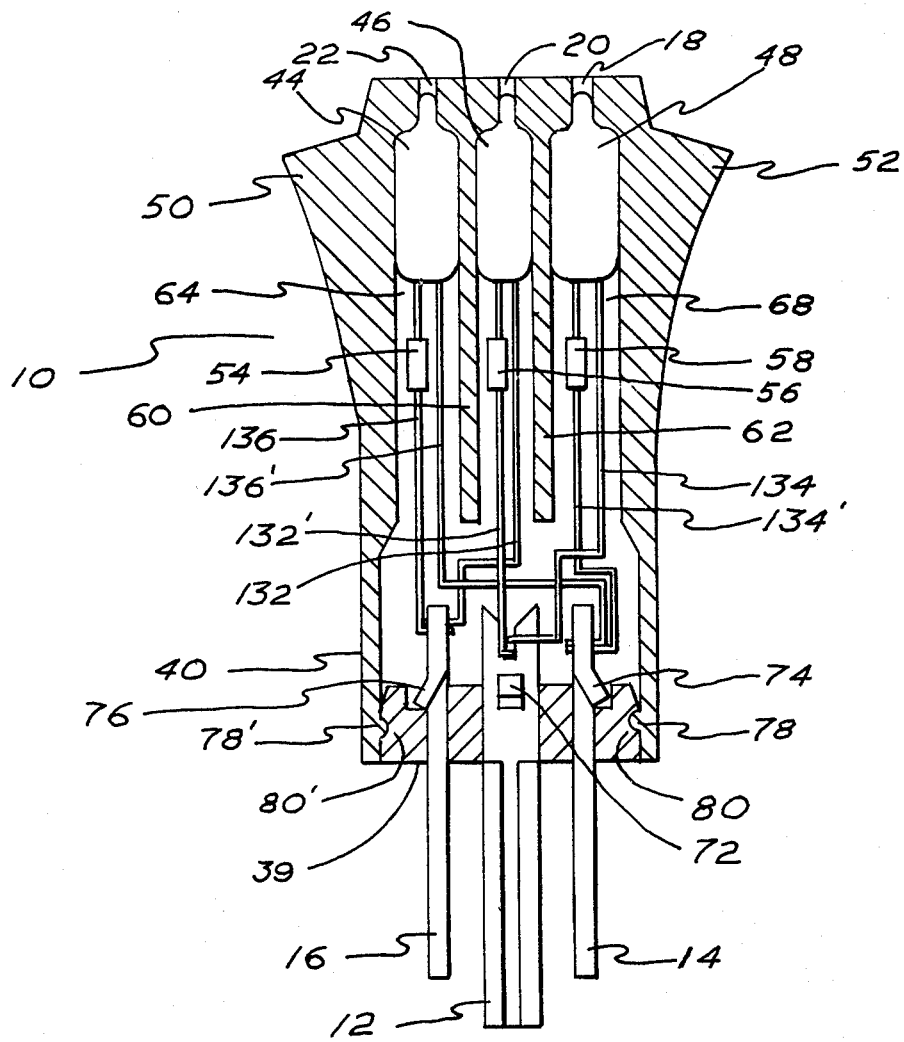
FIG. 2 is a view of the device along section 2—2 of FIG. 1 showing the indicator lamps connected to the prongs.

FIG. 2 is a view taken along sectional lines 2—2 shown in FIG. 1. The embodiment shown in FIG. 2 has an insulating base 39 containing prongs 12, 14, and 16. The base has been inserted into the housing 40 as shown. The housing 40 has raised surfaces 50 and 52 which are convenient for gripping the tester as it is removed from an outlet.

The manner in which the prongs 12, 14 and 16 are connected with the lights 44, 46, and 48 is also shown in FIG. 2. Light 44 is connected between prongs 14 and 16 by wires 136 and 136'. Light 46 is connected between prongs 16 and 12 by wires 132 and 132'. Light 48 is connected between prongs 12 and 14 by wires 134 and 134'. Ballast resistors 54, 56 and 58 are also shown. It can be seen that one light is connected between each pair of the three prongs. FIG. 3 shows a diagram of this circuit. Terminals 82, 84 and 86 correspond to prongs 12, 14 and 16. Lights 44, 46 and 48 correspond to elements 88, 90, and 92. Elements 88, 90 and 92 are intended to refer to any indicator or light emitting components suitable for use in such a device.

When viewed in connection with FIG. 2, FIG. 4 shows the relatively simple assembly operations that might be required with the particular components used in one embodiment of this tester. FIG. 4 shows the base 39 which is generally rectangular in shape and has three rectangular holes 122, 124 and 126 through it and opening onto the two largest faces, 128 and the opposite face 128'. The holes 122, 124 and 126 are large enough for the prongs 12, 14, and 16 to be pushed through them. The holes are also arranged so that after their insertion into the holes, the prongs will be suitably positioned for use with an electrical outlet.

Prongs 14 and 16 are identical and generally of the type used in standard two wire electrical plugs. At a point approximately equidistant from the ends, the width of prongs 14 and 16 is reduced to form shoulder 104 and 106 respectively. The ends of the narrower portions of prongs 14 and 16 are V-shaped and have slots 114, 116 respectively. Between the slots and shoulders (114 and 104 of prong 14) of prongs 14 and 16 rectangular portions 74 and 76 respectively have been stamped or wedged partially out of the prongs. Blunt surfaces, represented by 75 on prong 74, face the shoulders of these prongs. The distance between wedge surface 75 and shoulder 104, as well as similar surfaces on prong 16, is approximately equal to the thickness of the insulating base 39. Prong 12 is similar to prongs 14 and 16 containing slot 112, wedge portion 72, and shoulder 102. The end of prong 12 opposite the slot 112 is, however, different from similar ends on prongs 14 and 16. Rather than being flat, this end of prong 12 is U-shaped. It might also be circular in shape. The only requirement is that this end of prong 12 must be shaped so that it will fit into the ground receptacle of an outlet.

The insulating base 39 is made of an appropriate material which will permit prongs 12, 14 and 16 to be pushed through holes 122, 124, 126 respectively. The wedged portions 72, 74 and 75 are sufficiently resilient for the terminals to be forced through the holes. After passing through the holes, however these wedge portions spring back to their normal position. The blunt ends, represented by surface 75 on prong 14 and present on all three prongs, then prevent removal of the prongs from the base. All three prongs 12, 14, and 16 will then be fixed to the base with the slotted portions of all three prongs on the same side and the portions which are to be plugged into a receptacle all on the other side.

The lights 44, 46 and 48 with their respective lead wires are also shown in FIG. 4. Contact between the prongs and the lights is established by forcing the appropriate wire into one of the three slots 112, 114 or 116. The circuitry to be used for this embodiment has already been discussed and is best seen in FIGS. 2 and 3.

FIG. 4 shows that the hollow insulating housing 40 with an open end 138. Inner wall portions 60 and 62 can be seen in FIGS. 3 and 4. Together with endwalls 42 and 42' these inner walls 60 and 62 form three parallel enclosed cavities 64, 66 and 68. The lights 44, 46 and 48 are positioned in these cavities as is best shown in FIG. 3. The lights are thus aligned with the viewing openings.

The open end 138 of the insulated housing 40 is shaped so as to receive the insulating base 39. Semicircular ridges 78 and 78' are located on the inside of end walls 42 and 42' and are proximate to open end of the housing. FIG. 2 offers the best view of ridges 78 and 78' along with a view of the mating semi-circular channels on opposite sides of the base 39. FIG. 4 also shows these features. When the base is pushed into the housing, those mating ridges 78 and 78' and channels 80, 80' securely lock the base in place because of the spring action of the housing acting against the base.

Figure 5:
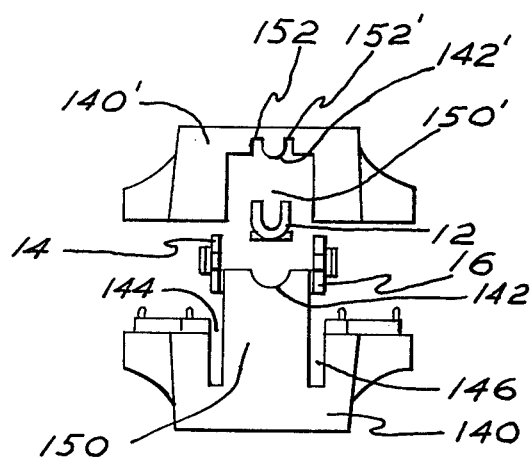
FIG. 5 is a view of the alternate housing shown in FIG. 5 showing the base portions of two mateable clamshells which comprise the housing.
Figure 6:
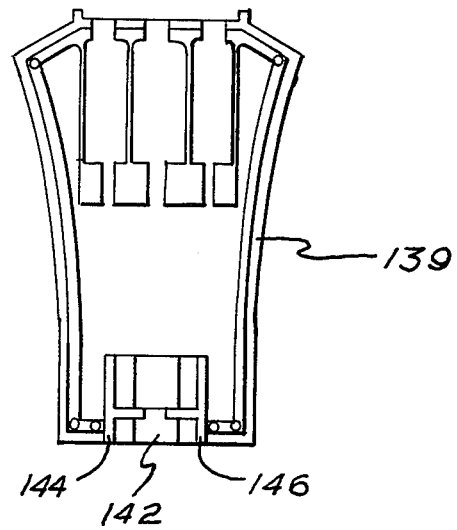
FIG. 6 shows a sectional view of an alternate housing again taken along section 2—2 in FIG. 1.

Another version of a housing assembly that can be utilized with this circuit tester is shown in FIGS. 5 and 6. This version merely employs two mateable clamshell portions such as that shown in FIG. 6. FIG. 5 shows the mating base portions 140 and 140' of this embodiment. The halfshell 140 has recesses 144 and 146 into which the prongs 14 and 16 can be slidably mounted. The edges of the rectangular insert 150 form the inner sides of channel 144, and 146. A semicircular channel 142 is located on the outermost end of insert 150. The semicircular portion of prong 12 will fit into this channel. Half-shell 140' has a cutout 150' which is adapted to receive insert 150. The innermost end of this cutout contains two slots 152' and 152 with a semicircular ridge 142' between the slots. When the clamshells are mated the semicircular portion of prong 102 will be positioned between channel 142, slots 152 and 152' and ridge 142'. In other respects, the same features may be employed with this embodiment as with that shown in FIG. 4. The insulating housing is made of any material suitable for simply fusing the clamshell halves.

The housing used in either of the embodiments shown will serve a purpose in addition to providing protective insulation for the components. It can be seen that each housing will comprise a frame upon which the components may be assembled. Each housing includes cavities 64, 66 and 68 for positioning the indicating elements. In both the prongs 12, 14, and 16 are held rigidly in place by the engagement of surfaces on the prongs with the base. The leads from the indicating elements can then be easily inserted into slots in the prongs.

It is apparent that specific embodiments other than that shown here can be readily envisioned. The use of these components which simplify assembly and the use of a configuration which permits alignment of the reference characters with the indicator lights might, for example, be used with a different circuit. The embodiments shown then are merely representative of a circuit tester which indicates wiring errors in a standard three-wire electrical outlet by means of distinctive patterns formed by three indicating elements such as lights and incorporates the disclosed components to simplify assembly.

What is claimed is:

1. A circuit tester for checking standard three-wire electrical outlets, said tester comprising:
an insulating housing comprising an insulating base having three electrical prongs extending therefrom, said prongs being adapted to be inserted, into the sockets of an electrical outlet, and a pair of sidewalls extending from two opposed edge portions of said base, a pair of opposed endwalls extending from said base between said sidewalls,
a top wall, said sidewalls and endwalls extending to said top wall,
circuit means within said housing between said base and said top wall for testing said three-wire outlet said circuit means having three indicator light means in alignment proximate to said top wall, apertures in said housing on said top wall and on both of said sidewalls, said apertures being individually aligned with one of said indicator light means, indicia on each of said sidewalls in alignment with said apertures, said indicia being selectively aligned with each of said apertures and annotated to denote specific faults in a circuit upon energizing specific indicator lights when said tester is plugged into an outlet.

2. A device as set forth in claim 1 said insulated housing comprising two mateable clamshell portions, said clamshell portions having slots in the base portions for receiving said prongs.

3. A circuit tester as set forth in claim 1 wherein said insulating housing has two inner walls, said inner walls extending between said sidewalls, being parallel to said endwalls and being spaced from said base of said housing, said inner walls together with said endwalls defining three side-by-side cavities extending from said top wall towards said base, one of said indicator light means being located in each of said cavities so that said indicator light means are separated to prevent visual interference.

4. A circuit tester as set forth in claim 1 wherein each of said prongs has a slot extending inwardly from one end of said prong, said one end being located within said housing with each of said prongs extending through said base and with wires extending from two of said indicator light means being poistioned in each of said slots to form electrical contact.

5. A circuit tester as set forth in claim 1 wherein the width of said endwalls is greater adjacent said base than adjacent said top wall and raised gripping surfaces extend outwardly from each of said endwalls adjacent said top wall.

6. A circuit tester for checking a standard grounded three-wire electrical outlet to determine if said outlet is properly wired, said circuit tester comprising:

a hollow insulating housing comprising two opposed sidewalls, two opposed endwalls extending therebetween, and a top wall and an opposed base, at least two inner walls spaced from said base, said inner walls, said sidewalls and said endwalls defining three internal cavities, three electrical indicator lights, one of said lights being located in each of said internal cavities, an aperture in said housing aligned with each of said indicator lights, three electrical prongs, said prongs extending through said base, each of said prongs having one end located within said housing and the other end external to said housing, said prongs being oriented for insertion of said external ends into a standard three-wire electrical outlet, a slot extending from said one internal end of each of said prongs, and two wires extending from each of said indicator lights, said wires emerging from said cavities with the two wires attached to each of said indicator lights being attached to different prongs, said wires inserted laterally of their axis into said slots to establish electrical contact with said prongs, whereby a properly wired electrical outlet will energize prescribed indicator lights and occurs an improperly wired outlet will result in some other lighting display.

* * * * *